(12) United States Patent
Su et al.

(10) Patent No.: US 8,324,634 B2
(45) Date of Patent: Dec. 4, 2012

(54) EPITAXIAL WAFER AND MANUFACTURING METHOD THEREOF

(75) Inventors: Xilin Su, Shenzhen (CN); Hongpo Hu, Shenzhen (CN); Chunlin Xie, Shenzhen (CN); Wang Zhang, Shenzhen (CN); Qiang Wang, Shenzhen (CN)

(73) Assignee: BYD Company Limited, Shenzhen (CN)

( * ) Notice: Subject to any disclaimer, the term of this patent is extended or adjusted under 35 U.S.C. 154(b) by 288 days.

(21) Appl. No.: 12/770,130

(22) Filed: Apr. 29, 2010

(65) Prior Publication Data
US 2010/0276812 A1    Nov. 4, 2010

(30) Foreign Application Priority Data

Apr. 30, 2009  (CN) .......................... 2009 1 0107169

(51) Int. Cl.
*H01L 33/01*    (2006.01)

(52) U.S. Cl. .................. 257/79; 257/773; 257/E33.001; 257/99

(58) Field of Classification Search ............ 257/79–103, 257/773
See application file for complete search history.

(56) References Cited

U.S. PATENT DOCUMENTS

| | | | |
|---|---|---|---|
| 7,427,772 B2 * | 9/2008 | Chuo et al. ...................... | 257/13 |
| 7,932,106 B2 * | 4/2011 | Li ................................... | 438/22 |
| 8,013,354 B2 * | 9/2011 | Lee et al. ......................... | 257/99 |
| 8,076,686 B2 * | 12/2011 | Yu et al. .......................... | 257/98 |
| 2005/0269575 A1 * | 12/2005 | Peng et al. ...................... | 257/79 |
| 2009/0042328 A1 * | 2/2009 | Niki et al. ....................... | 438/46 |
| 2009/0272994 A1 * | 11/2009 | Lim ................................ | 257/97 |
| 2009/0309126 A1 * | 12/2009 | Okuno ........................... | 257/103 |
| 2012/0013827 A1 * | 1/2012 | Yoon ............................... | 349/96 |

* cited by examiner

*Primary Examiner* — Savitr Mulpuri
(74) *Attorney, Agent, or Firm* — Alston & Bird LLP

(57) ABSTRACT

A semiconductor device comprises a substrate, a conductive layer deposited on a substrate and an epitaxial layer deposited on the conductive layer. The conductive layer is patterned to include a first pattern. The first pattern includes a major surface and a plurality of grids defined in the major surface. The major surface includes a plurality of first lines and a connecting portion. The connecting portion is connected to an electrode. The epitaxial layer covers the grids and the first lines between the adjacent grids.

9 Claims, 6 Drawing Sheets

EPITAXIAL WAFER AND MANUFACTURING METHOD THEREOF

CROSS-REFERENCE TO RELATED APPLICATION

This application claims foreign priority benefits under 35 U.S.C. §119 of Chinese Patent Application Serial No. 200910107169.6, filed on Apr. 30, 2009, the content of which is incorporated herein by reference in its entirety.

TECHNICAL FIELD

Exemplary embodiments of the present invention relate to a semiconductor device and manufacturing methods thereof, in particular, relates to an epitaxial wafer of the semiconductor device and methods for manufacturing the same.

BACKGROUND

Gallium nitride and related III-V nitride materials such as GaN, InGaN, AlGaN and AlGaInN have a direct band gap that is continuously adjustable between 0.7-6.2 eV. They are suitable for use in a variety of devices, such as optoelectronic and microelectronic devices that operate in a wide spectral range from ultraviolet to infrared. Nevertheless, dislocations in III-V nitride materials may cause electrical defects that may limit the lifetime of the devices.

FIG. 1 illustrates a GaN-based device 100. The GaN-based device is generally formed by growing an epitaxial layer on a substrate. As illustrated in FIG. 1, the device 100 includes a sapphire substrate 102, an N-type GaN layer 104 deposited on the sapphire substrate 102, an active layer 106 deposited on the N-type GaN layer 104, and a P-type GaN layer 108 deposited on the active layer 106. An N-type electrode 110 is deposed on the N-type GaN layer 104, and a P-type electrode 112 is deposed on the P-type GaN layer 108. The device 100 is electrically connected to an external power source through the N electrode 110 and the P electrode 112. During operation, a current passes from the P-type electrode 112 into the N-type electrode 108 via the P-type GaN layer 110, the light emitting layer 106, and the N-type GaN layer 104.

Currently, most GaN-based devices have been manufactured by heteroepitaxial deposition of GaN-based layers on the substrates. During the deposition of the GaN-based layers, heteroepitaxy is performed on highly lattice and mismatched substrates such as sapphire or silicon which invariably induces a high density of dislocations. The resulting heteroepitaxial layers are therefore highly defected and highly conducting as a result of defects and impurities.

BRIEF SUMMARY

According to one exemplary embodiment of the invention, a semiconductor device comprises a substrate and a conductive layer deposited on the substrate. The conductive layer is patterned to include a first pattern. The first pattern includes a major surface and a plurality of grids defined in the major surface. The major surface includes a plurality of first lines and a connecting portion. The connecting portion is connected to an electrode. The semiconductor device further includes an epitaxial layer deposited on the conductive layer. The epitaxial layer covers the grids and the first lines between the adjacent grids.

According to one exemplary embodiment of the invention, a method for growing an epitaxial layer in a semiconductor device comprises providing a substrate, depositing a conductive layer on the substrate; and patterning the conductive layer to include a first pattern. The first pattern includes a major surface and a plurality of trenches defined in the major surface. The major surface includes a plurality of first lines and a connecting portion. The connecting portion is connected to an electrode. The method further comprises depositing an epitaxial layer on the patterned conductive layer. The epitaxial layer covers each of the trenches and the first lines between the adjacent trenches.

According to one exemplary embodiment of the invention, a method for depositing an epitaxial layer in a semiconductor device comprises providing a substrate, depositing a conductive layer on the substrate, and depositing a first semiconductor layer on the conductive layer. The conductive layer is patterned to include a major surface, a first group of trenches defined in the major surface, and a second group of trenches defined in the major surface. The major surface includes a plurality of first lines and a connecting portion. Each of the trenches in the first group is separated by the first line. The first group of trenches is separated from the second group of trenches by a second line. The first semiconductor layer covers the trenches and the first lines. The connecting portion is electrically connected to an electrode. The second line is wider than the first line.

DETAILED DESCRIPTION

Figure 1:
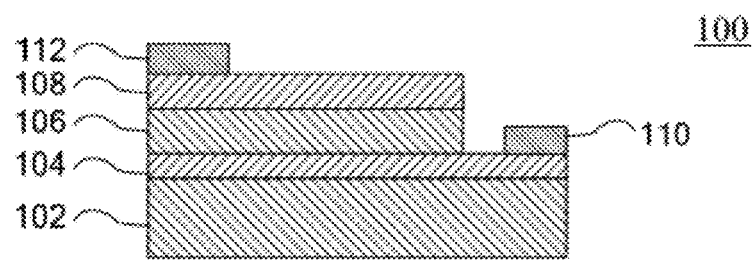
FIG. 1 illustrates a cross-sectional view of an epitaxial layer deposited on a substrate according to the prior art.
Figure 2A:
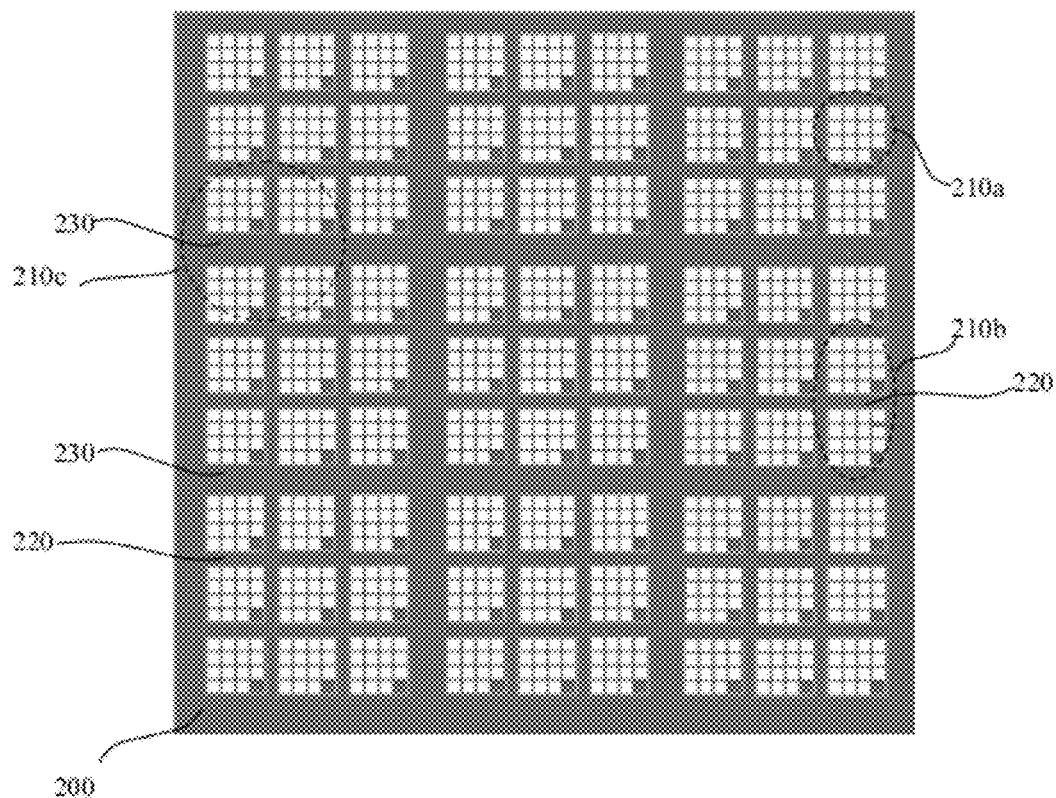
FIG. 2A illustrates a top view of a conductive layer including grids on a substrate according to one exemplary embodiment of the present invention.
Figure 2B:
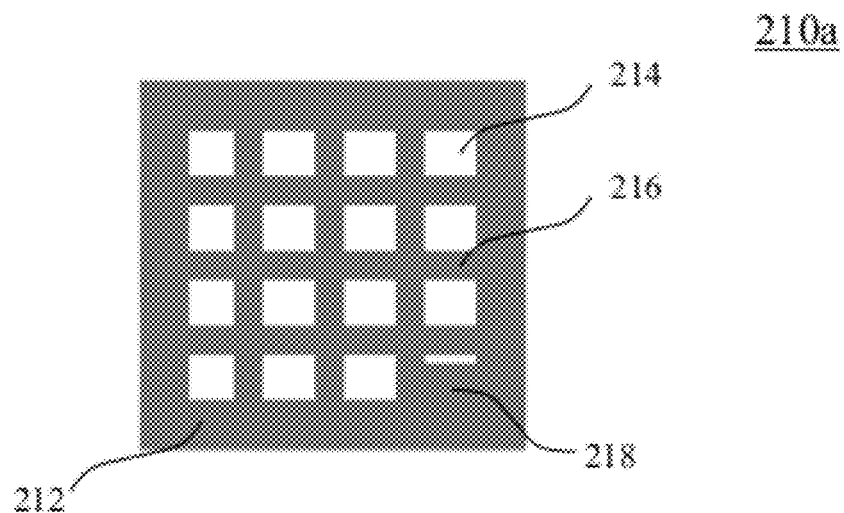
FIG. 2B illustrates an enlarge view of FIG. 2A according to one exemplary embodiment of the present invention.

FIG. 2A illustrates a top view of a conductive layer including grids on a substrate according to one exemplary embodiment of the present invention ("exemplary" as used herein referring to "serving as an example, instance or illustration"). Referring to FIG. 2A, a conductive layer 200 is deposited on a substrate (not shown). The conductive layer 200 is patterned to include a first pattern 210a. FIG. 2B illustrates an enlarge view of the first pattern 210a according to one exemplary embodiment of the present invention. As shown in FIG. 2B, the first pattern 210a includes a major surface 212 and a group of grids 214 defined in the major surface 212. The major surface 212 has a plurality of first lines 216 between the adjacent grids, and a connecting portion 218 used for connecting to an electrode (not shown). The connecting portion 218 may be in the corner of the first pattern 210a as shown in FIG. 2B, or in other placements of the first pattern 210a. In some exemplary embodiments, the first line 216 may have a width of about 1-20 μm. The connecting portion 218 may be wider than the first line 216, for example, 2 μm wider than the first line 216. For a convenient description, the first lines 216 illustrated in FIG. 2A and FIG. 2B are paralleled lines between the adjacent grids 214. However, the first lines 216 can be direct lines, curves or any other lines and can be intersected with each other.

Referring back to FIG. 2A, in one exemplary embodiment, the conductive layer 200 may be patterned to have a second pattern 210b. The second pattern 210b includes at least two first patterns 210a. The two first patterns 210a are separated by a second line 220. In various exemplary embodiments, the width of the second line 220 is approximately between 5 and 1000 μm. The connecting portion 218 may be electrically connected to the second line 220. In this exemplary embodiment, the second pattern 210b is of rectangle. However, the second pattern 210b can be of any shapes, such as polygon, ellipse or circle. The polygon can be any one of equilateral triangle, rectangle, square, parallelogram or hexagon.

In some circumstances, semiconductor devices may have a large size wafer or substrate, for example, having a diameter of over 3 inches. In this case, the conductive layer 200 may be patterned to include a plurality of third patterns 210c, thereby allowing the growth of epitaxy on large size wafers with fewer defects. Each of the third patterns 210c includes at least two second patterns 210b. The at least two second patterns 210b are separated by a third line 230 which is about 200-5000 μm wide.

Figure 3A:
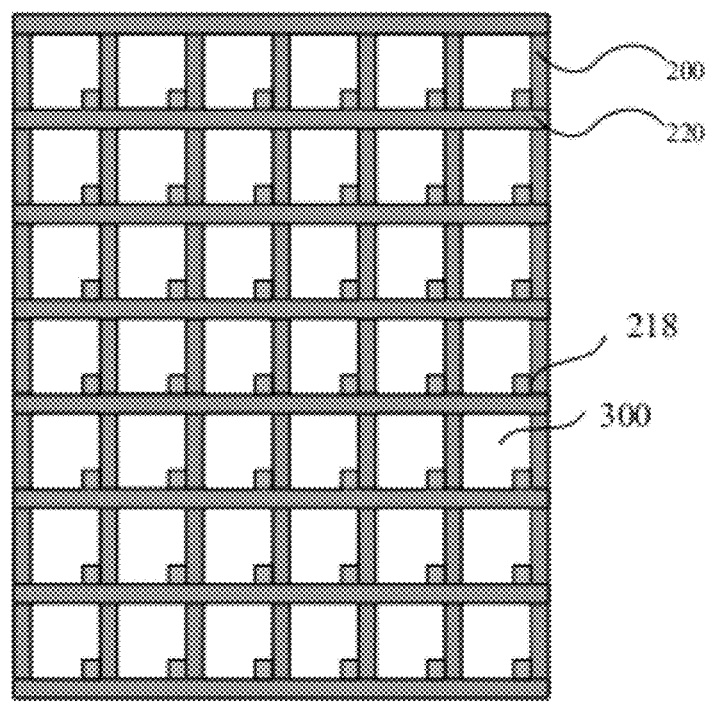
FIG. 3A illustrates a top view of an epitaxial layer covering a portion of a conductive layer according to one exemplary embodiment of the present invention.

FIG. 3A illustrates a top view of an epitaxial layer covering a portion of a conductive layer according to one exemplary embodiment of the present invention. In FIG. 3A, an epitaxial layer 300 is deposited on the conductive layer 200. The epitaxial layer 300 covers the grids (not shown in FIG. 3A, referred as 214 in FIG. 2B) and the first lines (not shown in FIG. 3A, referred as 216 in FIG. 2B) between the adjacent grids. The connecting portion 218 may not be covered or may be partially covered by the first layer 301, and is electrically connected to the electrode (not shown). In this exemplary embodiment, the second line 220 is about 50 μm wide. The thickness of the conductive layer 200 is about 200 μm.

Figure 3B:
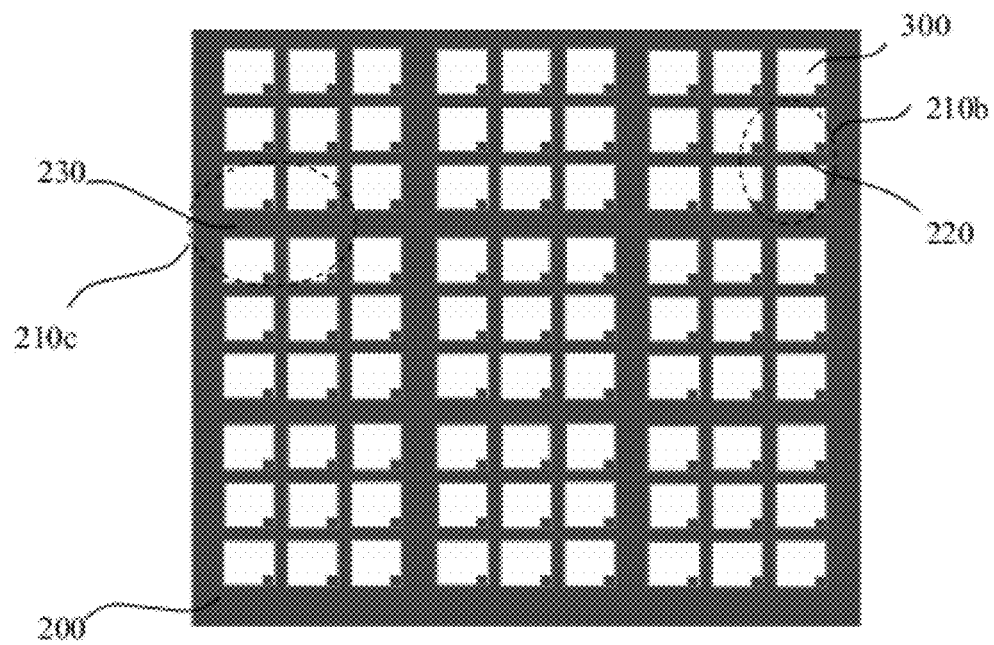
FIG. 3B illustrates a top view of an epitaxial layer covering a portion of a conductive layer according to one exemplary embodiment of the present invention.

FIG. 3B illustrates a top view of an epitaxial layer covering a portion of a conductive layer according to another exemplary embodiment of the present invention. In this exemplary embodiment, the wafer or substrate (not shown) may have a larger size than the one described in FIG. 3A. In order to reduce or eliminate the warp that may be caused by the increases in wafer size, the conductive layer 200 may be divided into a plurality of third patterns 210c, thereby allowing the growth of the epitaxy on the large size substrate with fewer defects. Similar to the pattern described in FIG. 2A, each of the third patterns 210c includes at least two second patterns 210b that are separated by the third line 230. Similar to the deposition of the epitaxial layer 300 described in FIG. 3A, the epitaxial layer 300 is deposited on the conductive layer 200. The epitaxial layer 300 covers the grids (not shown in FIG. 3B, referred as 214 in FIG. 2B) and the first lines (not shown in FIG. 3B, referred as 216 in FIG. 2B) between the adjacent grids. As a result of the divisions, the deposition of the epitaxial layer 300 may be applied in a substrate as small as the embodiment described in FIG. 2B. The heat may therefore be distributed evenly in the substrate which may reduce or eliminate thermal stress of the substrate, thus reducing the warp of the large size substrate. The dislocations of the substrate may be prevented from inducing to the layers deposited above the conductive layer 200 accordingly.

Figure 4:
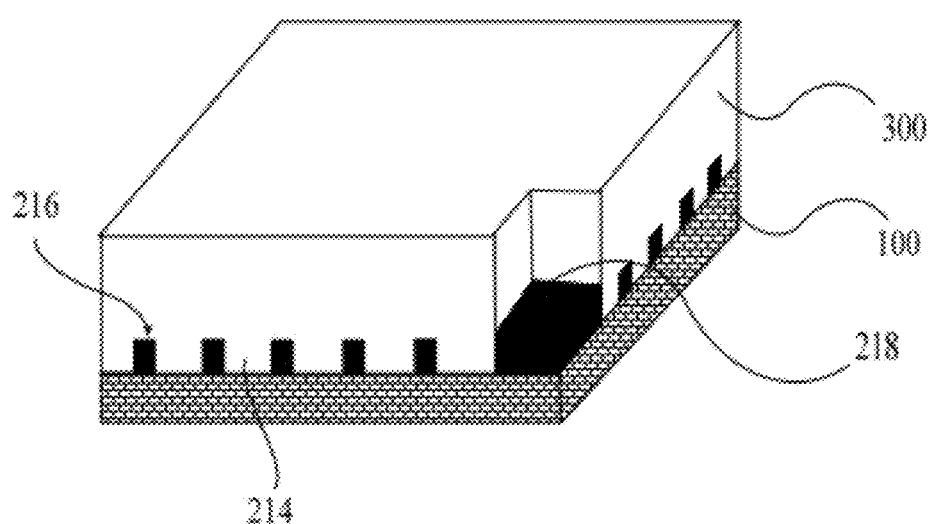
FIG. 4 illustrates a three-dimensional diagram of an epitaxial layer covering a portion of a conductive layer according to one exemplary embodiment of the present invention.

FIG. 4 illustrates a three-dimensional diagram of an epitaxial layer covering a portion of a conductive layer according to one exemplary embodiment of the present invention. As shown in FIG. 4, the conductive layer (not numbered in FIG. 4, referred as 200 in FIG. 2B) is formed on the substrate 100. A group of grids 214 are formed and defined in the conductive layer. The epitaxial layer 300 is deposited on the conductive layer and covers the grids 214. The epitaxial layer 300 also covers the first lines 216 between the adjacent grids 214. The connecting portion 218 may be not covered or may not be entirely covered by the first layer 301, and is prepared for an electrical connection to an electrode (not shown).

Figure 5:
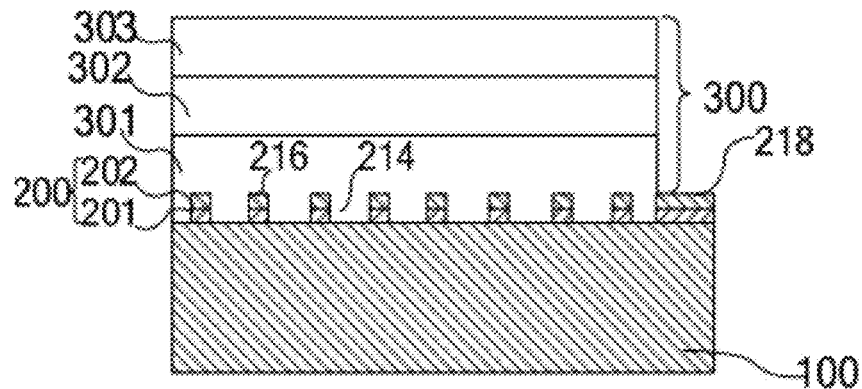
FIG. 5 illustrates a cross-sectional view of an epitaxial layer covering a portion of a conductive layer according to one exemplary embodiment of the present invention.

FIG. 5 illustrates a cross-sectional view of an epitaxial layer covering a portion of a conductive layer according to one exemplary embodiment of the present invention. With reference to FIG. 5, the conductive layer 200 is formed on the substrate 100. A group of grids 214 are formed and defined in the conductive layer 200. The epitaxial layer 300 is deposited on the conductive layer 200, covers the grids 214, and also covers the first lines 216 between the adjacent grids 214. The epitaxial layer 300 may include a first layer 301, an active layer 302 and a second layer 303. The first layer 301 is of a first semiconductor material and the second layer 303 is of a second type of semiconductor material. An active layer 302, such as a light emitting layer having a multiquantum-well Ga structure, is deposited between the first layer 301 and a second layer 303. The first layer 301 may be a P-type GaN layer, and the second layer 302 may be an N-type GaN layer; or alternatively, the first layer 301 may be an N-type GaN layer, and the second layer 303 may be a P-type GaN layer. The material of the epitaxial layer 300 includes any of the III-V nitride material, such as GaN, InGaN, AlGaN or AlGaInN. In one exemplary embodiment, the epitaxial layer 300 includes $Al_XGa_YIn_{1-X-Y}N$ where X and Y satisfy $0 \leq X \leq 1$, $0 \leq Y \leq 1$, and $0 \leq 1-X-Y \leq 1$. The connecting portion 218 may be not entirely covered by the epitaxial layer 300, and is electrically connected to the electrode. To further improve the crystal quality of the epitaxial layer 300, a buffer layer (not shown) may be deposited between the substrate 100 and the epitaxial layer 300. The buffer layer may include any of GaN, AlN or AlGaN.

The conductive layer 200 may improve the adhesion of the epitaxial layer 300 to the substrate 100, as well as the electrical contact between the conductive layer 200 and the epitaxial layer 300. The conductive layer 200 may be a single layer or may include two or more sub-layers. In the exemplary embodiment illustrated in FIG. 5, the conductive layer 200 includes two sub-layers. A Tungsten sub-layer 201 is deposited on the substrate 100, and an Aluminum sub-layer 202 is deposited on the Tungsten sub-layer 201.

FIGS. 6A-6F illustrate a process of depositing an epitaxial layer according to one exemplary embodiment of the present invention.

Figure 6A:
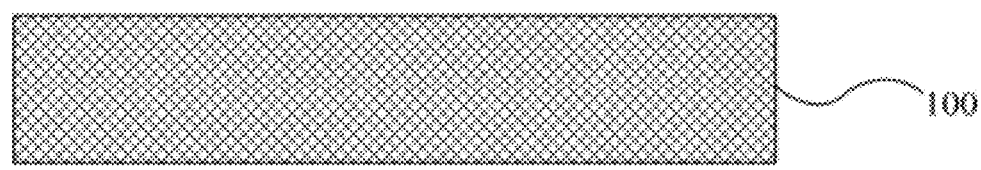
FIGS. 6A-6F illustrate a process of depositing an epitaxial layer according to one exemplary embodiment of the present invention.

Referring to FIG. 6A, a substrate 100 is provided. The substrate can be one of, but not limited to, sapphire, silicon carbide or silicon. In one exemplary embodiment, a sapphire substrate is provided.

Figure 6B:
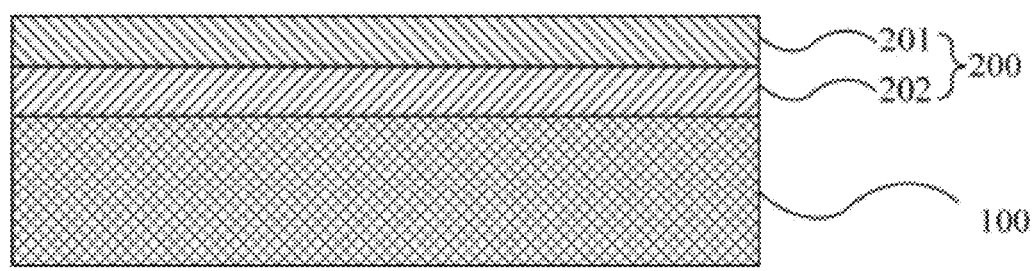

In FIG. 6B, a conductive layer 200 is deposited on the substrate 100. Depending on various applications, the conductive layer 200 may be made of, but not limited to, Tungsten, Molybdenum, Titanium, Copper, Nickel, Tantalum, Niobium, Aluminum, Silver, Iron, Cobalt, Zirconium, Yttrium, or alloy of the metals that are selected from the aforementioned metals. In other exemplary embodiments, the conductive layer 200 may be made from nonmetallic conductive material selected from conductive ceramic or conductive epoxy resin. The conductive layer 200 may have a thickness of about 5-5000 μm. It may include a single layer or multiple sub-layers as described in FIG. 5. When it includes a single layer, the conductive layer 200 may be made of any metal material, alloy or doped metal, such as Nickel, Nickel-Copper alloy or Nickel doped Copper. When it includes multiple sub-layers, the conductive layer 200 may include a plurality of sub-layers such as a Copper sub-layer, a Molybdenum sub-layer and a Nickel sub-layer. The multiple sub-layers may be deposited on the substrate 100 by Molecular Beam Epitaxy (MBE) process or Metal Organic Chemical Vapor Deposition (MOCVD) process. Each of the sub-layers can be applied to the substrate 100 alternatively or subsequently two or more times. In this exemplary embodiment shown in FIG. 6B, the conductive layer 200 includes a Tungsten sub-layer 201 deposited on the substrate 100 and an Aluminum sub-layer 202 deposited on the Tungsten sub-layer 201. Each of the sub-layer may have a thickness of about 100 μm.

Figure 6C:
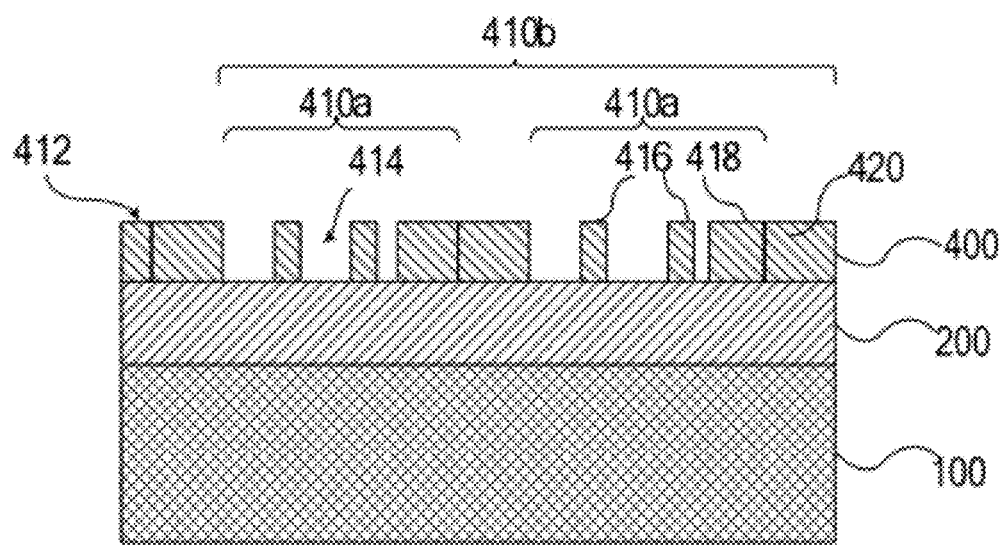

Referring to FIG. 6C, a photoresist layer 400 is deposited on the conductive layer 200. Using a photolithographic process, a pattern is defined on the photoresist layer 400. In one exemplary embodiment, the pattern may include a first pattern 410a. The first pattern 410a may include a major surface 412 and a group of trenches 414 defined in the major surface 412. The major surface 412 may have a plurality of first lines 416 between the adjacent trenches 414 and a connecting portion 418. The first lines 416 and the trenches 414 may form a grid pattern similar to the pattern shown in FIG. 2A. The first line 416 may have a width of about 1-20 μm. The connecting portion 418 may be wider than the first line 416, for example, 2 μm wider than the first line 416. The first line 416 can be of any shapes, such as direct lines, curves or any other shapes and can be intersected with each other. In some exemplary embodiments, the photoresist layer 400 may include at least two first patterns 410a, referred to as a second pattern 410b shown in FIG. 6C. The two first patterns 410a is separated from the adjacent one by a second line 420. The width of the second line 420 is approximately between 5 and 1000 μm. The second line 420 can be of any shapes, such as polygon, ellipse or circle. In some exemplary embodiments, the photoresist layer 400 may include at least two second patterns if it is applied to a large size substrate, for example, having a diameter over 3 inches.

Figure 6D:
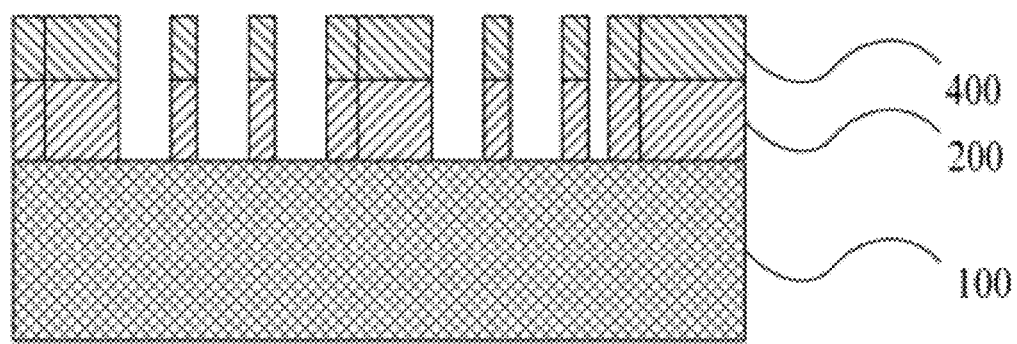
Figure 6E:
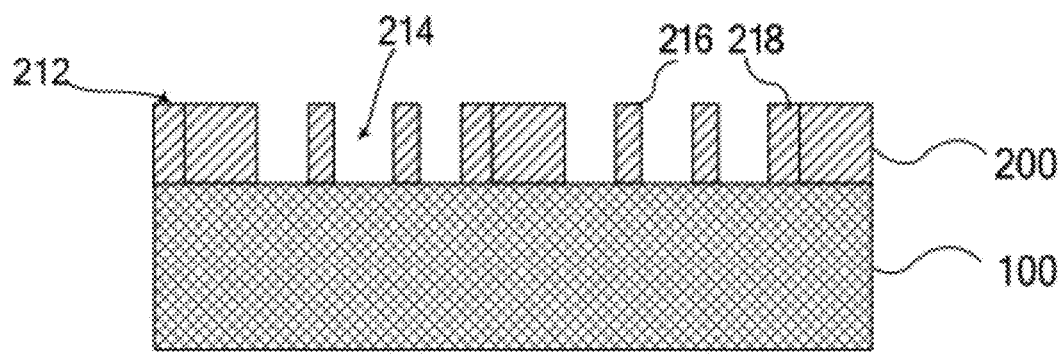
Figure 6F:
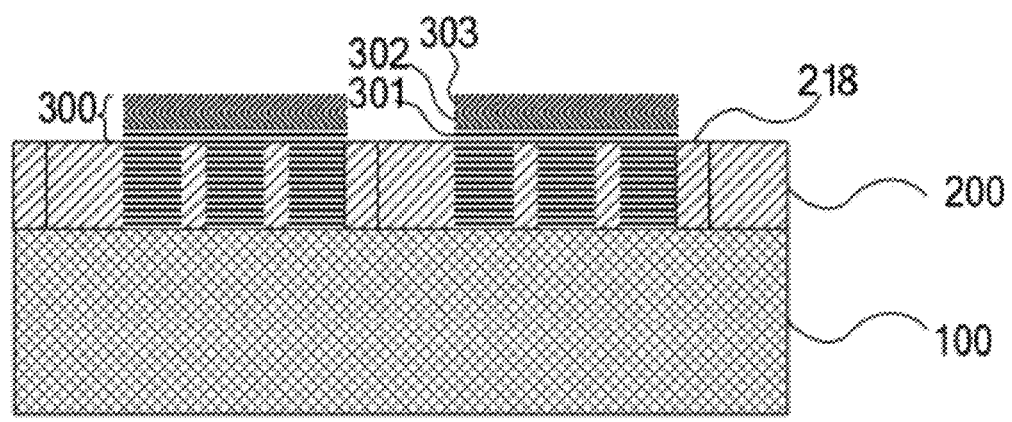

As illustrated in FIG. 6D, the photoresist layer 400 is then subjected to drying etching or wet etching by which the pattern is transferred to the conductive layer 200. The underlying layer (e.g., the conductive layer 200) of the photoresist layer 400 is then selectively etched until the substrate 100 is reached, thereby forming a pattern which has been described in FIG. 2A. In the next step shown in FIG. 6E, the residue of the photoresist layer 400 is removed from the conductive layer 200. With reference to both FIG. 6E and FIG. 6F, the first layer 301, the active layer 302 and the second layer 303 of the epitaxial layer 300 are then subsequently deposited on the conductive layer 200, covering the trenches 214, and the first lines 216 between the adjacent trenches 214. The connecting portion 218 may be not entirely covered by the epitaxial layer 300 and is electrically connected to an electrode (not shown). The deposition of the epitaxial layer 300 on the conductive layer 200 uses various processes known to one skill in the art, such as the MOCVD process. An annealing process is subsequently performed in the MOCVD reactor at temperature above 400° C.

It will be appreciated by those skilled in the art that changes could be made to the examples described above without departing from the broad inventive concept. It is understood, therefore, that this invention is not limited to the particular examples disclosed, but it is intended to cover modifications within the spirit and scope of the present invention as defined by the appended claims.

What is claimed is:

1. A semiconductor device, comprising:
   a substrate;
   a conductive layer deposited on the substrate, the conductive layer being patterned to include a first pattern and a second pattern, the first and second patterns including a major surface and a plurality of grids defined in the major surface, the first pattern including a plurality of first lines between adjacent grids and a connecting portion, the second pattern including at least two first patterns, each of the at least two first patterns being separated by a second line, the connecting portion is being connected to an electrode and adjacent to the second line, wherein the first lines have a different width than the second lines; and
   an epitaxial layer deposited on the conductive layer, the epitaxial layer including a first layer, an active layer deposited on the first layer, and a second layer deposited on the active layer and covering the grids and the first lines and the second lines between the adjacent grids.

2. The semiconductor device of claim 1, wherein the first layer is of a first semiconductor material and the second layer is of a second type of semiconductor material.

3. The semiconductor device of claim 1, wherein the first line has a width of about 1-20 μm.

4. The semiconductor device of claim 1, wherein the second line has a width of about 5-1000 μm.

5. The semiconductor device of claim 4, wherein the conductive layer is patterned to include a third pattern, the third pattern including at least two second patterns, each of the at least two second patterns being separated by a third line, wherein the third line has a width of about 200-5000 μm.

6. The semiconductor device of claim 5, wherein the connecting portion is adjacent to the third line.

7. The semiconductor device of claim 1 further comprising a buffer layer deposited on the substrate.

8. The semiconductor device of claim 1, wherein the conductive layer comprises a plurality of metal layers.

9. The semiconductor device of claim 1, wherein the shape of the grids comprises one of polygon, ellipse or circle shapes.

* * * * *